United States Patent
Omote et al.

(10) Patent No.: US 10,303,316 B2
(45) Date of Patent: May 28, 2019

(54) METHOD FOR MANUFACTURING TOUCH SENSOR

(71) Applicant: NISSHA PRINTING CO., LTD., Kyoto-shi, Kyoto (JP)

(72) Inventors: Ryomei Omote, Kyoto (JP); Takao Hashimoto, Kyoto (JP); Takeshi Nishimura, Kyoto (JP)

(73) Assignee: NISSHA CO., LTD., Kyoto (JP)

( * ) Notice: Subject to any disclaimer, the term of this patent is extended or adjusted under 35 U.S.C. 154(b) by 0 days.

(21) Appl. No.: 15/550,854

(22) PCT Filed: Apr. 8, 2016

(86) PCT No.: PCT/JP2016/061527
§ 371 (c)(1),
(2) Date: Aug. 14, 2017

(87) PCT Pub. No.: WO2016/194474
PCT Pub. Date: Aug. 12, 2016

(65) Prior Publication Data
US 2018/0018041 A1    Jan. 18, 2018

(30) Foreign Application Priority Data

May 29, 2015  (JP) ................. 2015-110824

(51) Int. Cl.
| | | |
|---|---|---|
| H01L 21/308 | (2006.01) | |
| G06F 3/044 | (2006.01) | |
| H05K 3/00 | (2006.01) | |
| H05K 3/06 | (2006.01) | |
| H05K 3/22 | (2006.01) | |
| G06F 3/041 | (2006.01) | |
| G03F 7/20 | (2006.01) | |

(52) U.S. Cl.
CPC ............ *G06F 3/044* (2013.01); *G06F 3/0416* (2013.01); *H05K 3/0023* (2013.01); *H05K 3/064* (2013.01); *H05K 3/22* (2013.01); *G03F 7/20* (2013.01); *G06F 2203/04103* (2013.01); *H05K 3/06* (2013.01); *H05K 2203/0307* (2013.01)

(58) Field of Classification Search
CPC . H01L 21/308; G03F 7/70466; G03F 7/2032; G03F 7/70283
USPC ............................................. 430/319
See application file for complete search history.

(56) References Cited

U.S. PATENT DOCUMENTS

| | | | |
|---|---|---|---|
| 2007/0074316 A1 | 3/2007 | Alden et al. | |
| 2013/0000954 A1* | 1/2013 | Hashimoto | G06F 3/044 174/250 |

FOREIGN PATENT DOCUMENTS

| | | |
|---|---|---|
| JP | 2010-021224 | 1/2010 |
| JP | 2014-210372 | 11/2014 |
| JP | 2015-011633 | 1/2015 |
| WO | 2014/132623 | 9/2014 |

OTHER PUBLICATIONS

International Search Report, dated Jun. 28, 2016 (Jun. 28, 2016), 2 pages.

* cited by examiner

*Primary Examiner* — Daborah Chacko-Davis
(74) *Attorney, Agent, or Firm* — Rankin, Hill & Clark LLP

(57) ABSTRACT

[Object] To provide a method for manufacturing a touch sensor capable of concurrently forming routed circuit patterns on both surfaces of a base film and capable of aligning the routed circuit patterns on the top and bottom surfaces with each other with high accuracy.

[Solution] A method for manufacturing a touch sensor includes forming electrode patterns on both surfaces of a base film through concurrent light exposure on both surfaces and development using photosensitive electrically conductive films each including a support film, an electrically conductive layer disposed on the support film and containing an electrically conductive fiber, and a second photosensitive resin layer disposed on the electrically conductive layer. Routed circuit patterns obtained by patterning the light-shielding metal layers are formed in advance on both surfaces of the base film.

18 Claims, 4 Drawing Sheets

METHOD FOR MANUFACTURING TOUCH SENSOR

TECHNICAL FIELD

The present invention relates to a method for manufacturing a touch sensor including a base film, an electrode, and a routed wire.

BACKGROUND ART

Small electronic devices, such as multifunctional mobile phones (smartphones), multifunctional mobile terminals (tablet computers), car navigation systems, mobile game machines, or electronic dictionaries, office automation (OA) or factory automation (FA) equipment, and other devices have a display including a capacitance touch sensor in its display screen to be capable of receiving inputs through the screen. Such a touch sensor includes an electrode, which is required to be transparent. The electrode is made of an electrically-conductive transparent film.

Examples that have been used thus far as a material of an electrically-conductive transparent film include indium-tin-oxide (ITO), indium oxide, and tin oxide, which have high visible-light transmittance. Mainstream electrodes in touch sensors are formed by patterning electrically-conductive transparent films made of the above-described material.

A typical method for patterning an electrically-conductive transparent film includes forming an electrically-conductive transparent film, then forming a resist pattern on the film by photolithography, and removing a predetermined portion of the electrically conductive film by wet-etching to form an electrically conductive pattern. In the case of an ITO or indium oxide film, a mixture of two liquids, hydrochloric acid and ferric chloride, is typically used as an etching liquid.

An ITO film or a tin oxide film is typically formed by sputtering. This sputtering, however, is likely to change the properties of the electrically-conductive transparent film depending on the types of sputtering, the power of sputtering, the pressure of gas, the temperature of the base film, or the types of the atmosphere gas. The difference in film qualities of electrically-conductive transparent films caused by the changes of the sputtering conditions causes variations of the etching speed at which the electrically-conductive transparent film is wet-etched and is more likely to reduce product yield due to patterning defects. The above-described method for forming an electrically conductive pattern involves a sputtering step, a resist-forming step, and an etching step. Thus, it takes a long time to finish these steps and its cost is a large burden.

A trial conducted these days to solve the above-described problems is to form a transparent electrically conductive pattern from a material that replaces a material such as ITO, indium oxide, or tin oxide. For example, PTL 1 below discloses a method for forming an electrically conductive pattern by forming, on a base film, an electrically conductive layer containing an electrically conductive fiber such as a silver fiber, then forming a photosensitive resin layer over the electrically conductive layer, and exposing the photosensitive resin layer to light through a pattern mask disposed on the photosensitive resin layer to develop the photosensitive resin layer.

PTL 2 below discloses the following method for forming an electrically conductive pattern. A transfer photosensitive electrically conductive film, including a laminate of a photic resin layer and an electrically conductive layer containing an electrically conductive fiber such as a silver fiber, is formed over a support film. This film is laminated on a base film such that the photosensitive resin layer is tightly attached to the base film. The photosensitive electrically conductive film is exposed to light through a pattern mask disposed on the photosensitive electrically conductive film. After the support film is removed, the photosensitive electrically conductive film is developed.

CITATION LIST

Patent Literature

PTL 1: US Patent Application No. 2007/0074316
PTL 2: pamphlet of PCT Application No. 2010/021224

SUMMARY OF INVENTION

Technical Problem

The inventors have been studying to dispose, on both surfaces of a base film, electrically conductive layers containing an electrically conductive fiber such as a silver fiber and to concurrently pattern the electrically conductive layers on the both surfaces with different patterns. Here, how to form routed circuits around an active area on both surfaces of the base film has been an issue. Specifically, a conceivable method is to perform printing by inkjet printing or silkscreen printing using an electrically conductive ink containing an electrically conductive fiber such as a silver fiber. Such a method is neither capable of concurrently performing processing on both surfaces of the base film nor aligning the top and bottom surfaces with each other with high accuracy.

Solution to Problem

To solve the above-described problem, a first aspect of the invention provides a method for forming a touch sensor, the method including a step of forming light-shielding metal layers on two surfaces of a base film having a UV-blocking function and first photosensitive resin layers on the light-shielding metal layers; a light exposure step of irradiating the first photosensitive resin layers on the light-shielding metal layers with ultraviolet light through different pattern masks over the two surfaces; a step of forming resist patterns by developing the first photosensitive resin layers subjected to light exposure; an etching step of forming routed circuit patterns by removing portions of the light-shielding metal layers not covered with the resist patterns; a step of removing the first photosensitive resin layers covering the routed circuit patterns at at least portions corresponding to connection portions; a light exposure step of irradiating the second photosensitive resin layers of the photosensitive electrically conductive films laminated on the two surfaces of the base film with ultraviolet light through different pattern masks over the two surfaces; and a development step of developing the second photosensitive resin layers subjected to light exposure to concurrently remove portions of the electrically conductive layers laminated on portions of the second photosensitive resin layers that are to be removed and to form electrode patterns electrically connected to the routed circuit patterns.

A second aspect of the invention is a method for forming a touch sensor according to the first aspect, wherein the second photosensitive resin layer has a thickness of 1 μm to 2 μm.

A third aspect of the invention is a method for forming a touch sensor, the method including a step of forming light-shielding metal layers on two surfaces of a base film having a UV-blocking function and first photosensitive resin layers on the light-shielding metal layers; a light exposure step of irradiating the first photosensitive resin layers on the light-shielding metal layers with ultraviolet light through different pattern masks over the two surfaces; a step of forming resist patterns by developing the first photosensitive resin layers subjected to light exposure; an etching step of forming routed circuit patterns by removing portions of the light-shielding metal layers not covered with the resist patterns; a step of removing the first photosensitive resin layers covering the routed circuit patterns at at least portions corresponding to connection portions; a step of laminating, on the two surfaces of the base film on which the routed circuit patterns are formed, photosensitive electrically conductive films, each including a support film, a second photosensitive resin layer disposed on the support film, and an electrically conductive layer disposed on the second photosensitive resin layer and containing an electrically conductive fiber, such that the electrically conductive layers are tightly attached to the two surfaces; a light exposure step of irradiating the second photosensitive resin layers of the photosensitive electrically conductive films laminated on the two surfaces of the base film with ultraviolet light through different pattern masks over the two surfaces; and a development step of developing the second photosensitive resin layers subjected to light exposure to concurrently remove portions of the electrically conductive layers laminated on portions of the second photosensitive resin layers that are to be removed and to form electrode patterns electrically connected to the routed circuit patterns.

A fourth aspect of the invention is a method for forming a touch sensor according to any one of the first to third aspects, wherein the total thickness of one of the second photosensitive resin layers and one of the electrically conductive layers is 1 to 3 μm.

A fifth aspect of the invention is a method for forming a touch sensor according to any one of the first to fourth aspects, wherein the step of removing the first photosensitive resin layers is performed to remove the entirety of the first photosensitive resin layers. The method further includes a step of covering portions of the light-shielding metal layers corresponding to the routed circuit patterns with PAS layers except the connection portions before the step of laminating the photosensitive electrically conductive films is performed.

A sixth aspect of the invention is a method for forming a touch sensor according to any one of the first to fifth aspects. The method further includes a roughening step of roughening portions of exposed surfaces of the light-shielding metal layers, the portions corresponding to the routed circuit patterns and overlapping the electrode patterns. The roughening step is performed before the step of laminating the photosensitive electrically conductive films is performed.

A seventh aspect of the invention is a method for forming a touch sensor according to the sixth aspect, wherein a surface roughened in the roughening step has an arithmetic mean roughness (Ra) of 1 nm to 50 nm measured in accordance with JIS B 0601-2001.

Advantageous Effects of Invention

The method for manufacturing a touch sensor according to the invention is structured as above and is thus capable of concurrently forming routed circuit patterns on both surfaces of a base film and the top and bottom surfaces are aligned with each other with high accuracy.

DESCRIPTION OF EMBODIMENTS

Figure 1:
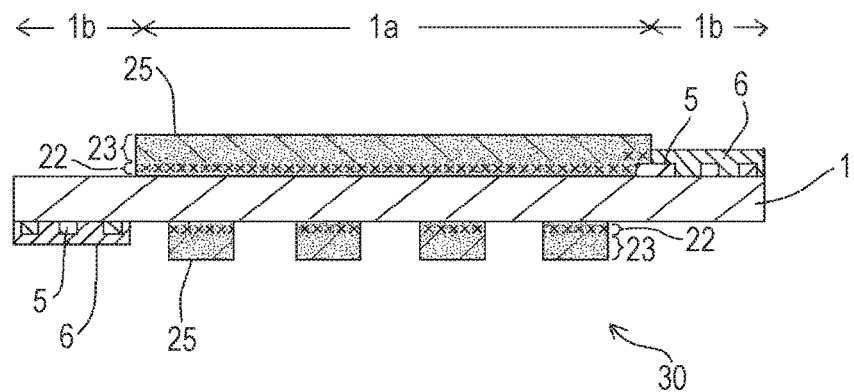
FIG. 1 is a schematic diagram of a touch sensor according to the invention.

Referring to the drawings, embodiments of the invention are described further in detail below. Unless otherwise specifically described, the properties of points or portions described in the embodiments of the invention such as the dimensions, the materials, the shapes, or the relative positions are not intended to limit the scope of the invention to these but are provided as mere examples for description.

First Embodiment

Touch Sensor

A touch sensor 30 is a capacitance touch sensor bonded to a back surface of a cover glass of a display window of an electronic device. Specifically, as illustrated in FIG. 1, the touch sensor 30 includes a transparent base film 1, electrically-conductive transparent films disposed on both surfaces of the base film 1 and each including an electrode pattern 25 in a center portion 1a, and electrically-conductive light-shielding films disposed on both surfaces of the base film 1 and each including a routed circuit pattern 5 in an external frame portion 1b.

Figure 2:
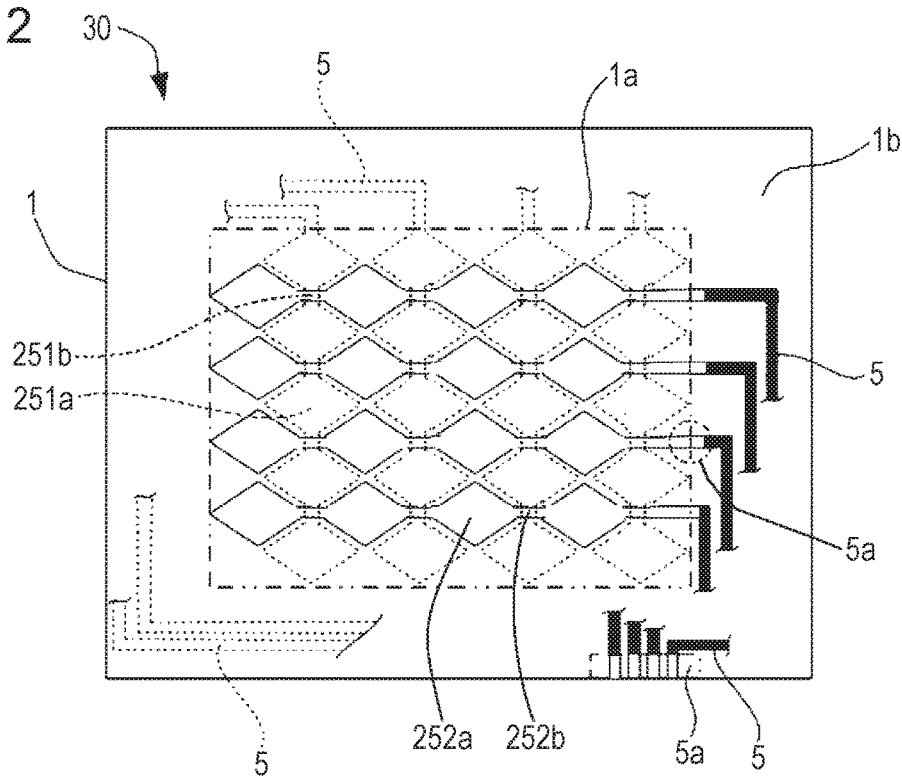
FIG. 2 is an enlarged plan view of a portion of a touch sensor according to the invention.

Here, the electrode patterns 25 formed in the center window portion 1a of the touch sensor 30 are supplementarily described. The electrode patterns 25 on the top and bottom surfaces are different patterns. For example, as illustrated in FIG. 2, the electrode pattern 25 on the bottom surface of the base film 1 includes, in the center portion 1a, rhombus electrodes 251a, having a rhombus shape when viewed in a plan, and connection wires 251b, each extending through multiple rhombus electrodes 251a in a vertical direction (Y direction) in the drawing. The multiple rhombus electrodes 251a and the corresponding connection wire 251b are electrically connected to one another. Sets, each including one connection wire 251b and multiple rhombus electrodes 251a through which the connection wire 251b extends, are repeatedly arranged side by side in the lateral direction (X direction) in the drawing. On the other hand, the electrode pattern 25 on the top surface of the base film 1 similarly includes, in the center portion 1a, multiple rhombus electrodes 252a and connection wires 252b, each extending through multiple rhombus electrodes 252a. In this case, however, the direction in which each connection wire 252b extends is the lateral direction (X direction) in the drawing, different from the direction in which each connection wire 251b extends. Accordingly, the direction in which sets, each including one connection wire 252b and multiple rhombus electrodes 252a through which the connection wire 252b extends, are repeatedly arranged side by side is the vertical direction (Y direction) in the drawing. As is clear from FIG. 2, the rhombus electrodes 251a are arranged so as to cover the gaps between the multiple connection wires 252b, whereas the rhombus electrodes 252a are arranged so as to cover the gaps between the multiple connection wires 251b. FIG. 2 also shows that the rhombus electrodes 251a and the rhombus electrodes 252a have a complementary positional relationship. Specifically, the multiple rhombus electrodes 252a are arranged so as to cover rhombus gaps produced as a result of arranging the rhombus electrodes 251a in a matrix.

In this manner, the X-direction electrodes and the Y-direction electrodes are arranged in a grid form when viewed in a plan. Thus, when a user touches any position of the grid with his/her finger or other object with the cover glass interposed therebetween, a capacitor is produced between the finger or the object and the X-direction electrode that he/she touches and a capacitor is produced between the finger or the object and the Y-direction electrode that he/she touches. The production of these capacitors increases the capacitance of the X-direction electrode and the Y-direction electrode. A position sensor of an external circuit detects the amount of change of the capacitance produced in such a case or also detects the X-direction electrode and the Y-direction electrode having the maximum capacitance and is capable of acquiring the position where the user has touched as a set of specific values of an X-coordinate value and a Y-coordinate value.

Figure 3:
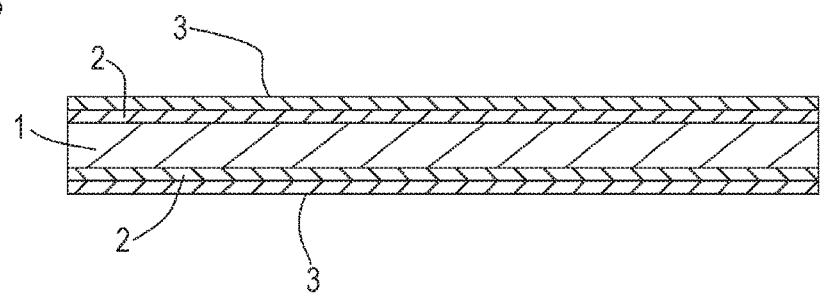
FIG. 3 is a schematic diagram of a step of forming a light-shielding metal layers and a first photosensitive resin layers.

A method for forming a touch sensor having the above-described configuration is described in detail below.
Method for Forming Routed Circuit A method for forming a routed circuit according to a first embodiment of the invention includes a step of forming light-shielding metal layers 2 on both surfaces of a base film 1 having a UV-blocking function and first photosensitive resin layers 3 on the respective light-shielding metal layers 2 (see FIG. 3), a light exposure step of irradiating the first photosensitive resin layers 3 on the light-shielding metal layers 2 with ultraviolet light 15 through different pattern masks 10 and 11 over both surfaces (see FIG. 4), a step of forming resist patterns 4 by developing the first photosensitive resin layers 3 subjected to light exposure (see FIG. 5), an etching step of forming routed circuit patterns 5 by removing portions of the light-shielding metal layers 2 that are not covered with the resist patterns 4 (see FIG. 6), a step of removing the entirety of the first photosensitive resin layers 3 that cover the routed circuit patterns 5 (see FIG. 7), and a step of covering portions of the light-shielding metal layers 2 corresponding to the routed circuit patterns 5 with PAS layers 6 except for the connection portions 5a (see FIG. 8).

1. Step of Laminating Light-Shielding Metal Layer and First Photosensitive Resin Layer The base film 1 is preferably made of a material having properties such as high transparency, high flexibility, and insulation properties. Examples of a material that satisfies such a demand include resin films made of a general-purpose resin, such as polyethylene terephthalate or acrylic resin, general-purpose engineering plastics, such as polyacetal resin or polycarbonate resin, and super-engineering plastics such as polysulfone resin or polyphenylene sulfide resin. The base film 1 may have a thickness of, for example, 25 μm to 100 μm. The base film 1 may be formed from a material such as a film glass.

The configuration in which electrodes and routed circuits are disposed on both surfaces of the transparent base film 1, as in the case of the embodiment, has the following problem. When, in the method for forming the electrode patterns 25 described below, cure patterns 24 of second photosensitive resin layers 23 are to be formed by photolithography, part of ultraviolet light 15 that has been emitted from the side of one surface of the base film 1 and that has not been absorbed by the corresponding second photosensitive resin layer 23 arrives at the second photosensitive resin layer 23 on the other surface of the base film 1. Thus, electrodes having different patterns are not allowed to be concurrently formed on both surfaces of the base film 1.

For concurrently exposing both surfaces with light, a layer having a UV-blocking function is used as the base film 1. Using a layer having a UV-blocking function as the base film 1 can prevent part of the ultraviolet light 15 emitted from the side of one surface of the base film 1 and not absorbed by the corresponding second photosensitive resin layer 23 from arriving at the second photosensitive resin layer 23 on the other surface of the base film 1. Examples of a light-absorbing material used to block the ultraviolet light 15 include a UV absorber or a resin having a UV absorbing function. A UV absorber may be added to the base film 1 or a resin constituting the base film 1 and a resin having a UV absorbing function may be copolymerized.

Examples of a UV absorber contained in the base film 1 include benzophenone-based, benzotriazole-based, benzoate-based, salicylate-based, triazine-based, and cyanoacrylate-based UV absorbers. Specifically, examples of a benzotriazole-based UV absorber include 2-(2H-benzotriazole-2-yl)-p-cresol, 2-(2H-benzotriazole-2-yl)-4-6-bis(1-methyl-1-phenylethyl)phenol, 2-[5-chloro(2H)-benzotriazole-2-yl]-4-methyl-6-(tert-butyl)phenol, 2-(2H-benzotriazole-yl)-4,6-di-tert-pentylphenol, and 2-(2H-benzotriazole-2-yl)-4-(1,1,3,3-tetramethylbutyl)phenol, and mixtures of these, modified products of these, polymers of these, and derivatives of these. Examples of a triazine-based UV absorber include 2-(4,6-diphenyl-1,3,5-triazine-2-yl)-5-[(hexyl)oxy]-phenol, 2-[4-[(2-hydroxy-3-dodecyloxypropyl)oxy]-2-hydroxyphenyl]-4,6-bis(2,4-dimethylphenyl)-1,3,5-triazine, 2-[4-[(2-hydroxy-3-tridecyloxypropyl)oxy]-2-hydroxyphenyl]-4,6-bis(2,4dimethylphenyl)-1,3,5-triazine, and 2,4-bis (2,4-dimethylphenyl)-6-(2-hydroxy-4-iso-octyloxyphenyl)-s-triazine, mixtures of these, modified products of these, polymers of these, and derivatives of these. These may be used alone or in combination of two or more.

The resin having the UV absorbing function is a resin obtained by introducing a polymerisable double-bond-containing functional group, such as a vinyl group, an acrylyl group, or a methacrylyl group, an alcoholic hydroxyl group, an amino group, a carboxyl group, an epoxy group, an isocyanate group, or other group into a nonresponsive UV absorber such as the above-described benzophenone-based, benzotriazole-based, benzoate-based, salicylate-based, triazine-based, or cyanoacrylate-based UV absorber. Any of these resins and the resin contained in a layer 20 or 40 on the base film 1 are copolymerized so as to be usable as the base film 1 having a UV absorbing function.

The content of the light-absorbing material is not particularly limited as long as the base film 1 can prevent light not absorbed by the second photosensitive resin layer 23 on one surface of the base film 1 from arriving at the second photosensitive resin layer 23 on the other surface.

Examples of the light-shielding metal layers 2 include a single metal film having high electric conductivity and high light-shielding properties and a layer made of an alloy or compound of such metals. The light-shielding metal layer 2 may be formed by, for example, vacuum deposition, sputtering, ion plating, or plating. Preferably usable metal examples include aluminium, nickel, copper, silver, and tin. Particularly, a metal film made of a copper foil and having a thickness of 20 to 1000 nm is highly preferable as it has high electric conductivity and light-shielding properties. More preferably, the thickness is greater than or equal to 30 nm. Further preferably, the thickness is 100 to 500 nm. This is because the light-shielding metal layer 2 having high electric conductivity is obtained when it has a thickness of greater than or equal to 100 nm and the light-shielding metal layer 2 that is easily handleable and workable is obtained when it has a thickness of smaller than or equal to 500 nm.

The first photosensitive resin layers 3 are exposed to light by, for example, a carbon-arc lamp, a mercury vapor arc lamp, a ultra-high pressure mercury-arc lamp, a high pressure mercury-arc lamp, or a xenon lamp. The first photosensitive resin layers 3 are made of, for example, an acrylic photoresist material having a thickness of 10 to 20 μm and developable by an aqueous alkali solution, described below. The first photosensitive resin layer 3 may be formed by disposing the material over the entire surface by, for example, a method using various types of coater, painting, dipping, or a dry film resist method, besides general-purpose printing such as gravure printing, screen printing, or offset printing, then exposing the material to light, developing the material, and patterning the material. Among these methods, a dry film resist method is most desirable.

A dry film resist (DFR) used in a dry film resist method is a film in which a photosensitive layer, which forms each of the first photosensitive resin layers 3, is interposed between a base film and a cover film. The above-described method such as printing, coating, or painting is only capable of single-side coating and has low efficiency and other disadvantages. On the other hand, the dry film resist method, which is a method of bonding a photosensitive layer using a heating roller after the cover film is removed, has been in the mainstream since it achieves high productivity and is capable of responding to various different needs. Here, light exposure is usually performed while the base film is covered with a pattern mask (not illustrated) and development is performed after the base film is removed. Examples usable as the base film of the dry film resist include a film made of, for example, polyethylene terephthalate. Examples usable as the cover film of the dry film resist include a film made of, for example, polyethylene.

2. Light Exposure Step

Examples of a light exposure method in the light exposure step include a method for emitting the ultraviolet light 15 in the form of an image through a pattern mask (through-mask light exposure method). Examples of a light source of the ultraviolet light 15 include a publicly-known light source that effectively emits ultraviolet rays, such as a carbon-arc lamp, a mercury vapor arc lamp, an ultra-high pressure mercury-arc lamp, a high pressure mercury-arc lamp, or a xenon lamp. Other devices that effectively emit ultraviolet rays, such as an Ar ion laser or a semiconductor laser, are also usable. Alternatively, a method for emitting the ultraviolet light 15 in the form of an image by direct drawing such as laser exposure may be employed.

Here, the base film 1 made of a resin film has a problem in terms of elongation. Concurrently exposing both surfaces to light as in the case of the invention is thus suitable to pattern the first photosensitive resin layers 3 each having a laminated body. This is because, when the surfaces of the first photosensitive resin layers 3 are alternately patterned through light exposure, the base film 1 may be elongated after patterning of one surface is finished and when the laminated body is reversed and attached again to the light exposure device, so that a cure pattern 3a on the top surface and a cure pattern 3a on the bottom surface may be misaligned with each other. In the case of the example illustrated in FIG. 2, the rhombus electrodes 251a and the rhombus electrodes 252a have a complementary positional relationship. Thus, the accuracy of the electrode patterns 25 is important. If the cure pattern 3a (finally, reversal pattern of routed circuit) on the top surface and the cure pattern 3a (finally, reversal pattern of routed circuit) on the bottom surface are misaligned with each other, connection between the cure patterns 3a and the electrode patterns 25 is rendered unreliable.

While both surfaces are concurrently exposed to light, the electrically-conductive light-shielding films block the ultraviolet light 15 from the opposite surfaces. Thus, concurrently exposing both surfaces to light using different mask patterns does not affect patterning of the opposite surfaces of the first photosensitive resin layers 3. Being capable of concurrently exposing both surfaces to light facilitates alignment of the cure pattern 3a on the top surface and the cure pattern 3a on the bottom surface, enables patterning on both surfaces with a single step, and achieves high productivity.

The top mask and the bottom mask can be aligned by a publicly known mask alignment method for a both-surface light exposure device. For example, mask alignment marks are made on the top mask and the bottom mask. A sensor that optically reads data, such as a camera, reads how a pair of mask alignment marks are superposed and obtains information on relative positions of the top mask and the bottom mask. On the basis of the positional information thus obtained, a mask positioning system moves the top mask and the bottom mask relative to each other so that the pair of the mask alignment marks are superposed such that their centers are aligned with each other to align the top mask and the bottom mask with each other.

Figure 4:
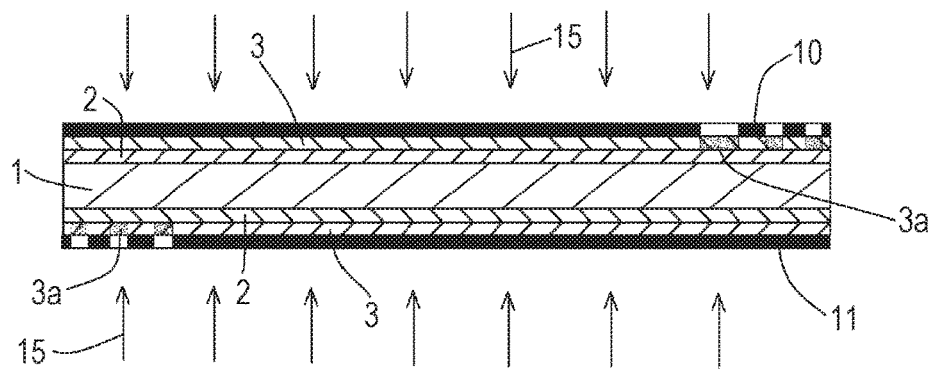
FIG. 4 is a schematic diagram of a step of exposing the first photosensitive resin layers to light.

After these steps are performed, a product in which the first photosensitive resin layers 3 each having the cure pattern 3a are disposed on the light-shielding metal layers 2 on both surfaces of the base film 1 is obtained (see FIG. 4).

3. Development Step

In a development step, the portion of each first photosensitive resin layer 3 except the cure portion is completely removed by wet development. Thus, a resist pattern 4 having a predetermined pattern is formed.

Wet development is performed by a publicly known method, such as spraying, swing immersion, brushing, or scraping, using, for example, a developer compatible with photosensitive resin such as an aqueous alkali solution, an aqueous developer, or an organic-solvent developer.

Usable developers are those which are safe, stable, and easily handleable, such as alkali hydroxide. Examples usable as the base of the aqueous alkali solution include an alkali hydroxide such as a lithium, sodium, or potassium hydroxide, a carbonate such as a lithium, sodium, potassium, or ammonium carbonate or bicarbonate, an alkali metal phosphate such as a potassium phosphate or a sodium phosphate, and an alkali metal pyrophosphate such as a sodium pyrophosphate or a potassium pyrophosphate. A surfactant, an antifoaming agent, a small amount of an organic solvent that enhances development, or other matter may be mixed into an aqueous alkali solution.

Alternatively, an aqueous developer containing water or an aqueous alkali solution and one or more organic solvents may be used. Examples of a base contained in the aqueous alkali solution include, besides the above-mentioned bases, borax, sodium metasilicate, tetramethylammonium hydroxide, ethanolamine, ethylenediamine, diethylenetriamine, 2-amino-2-hydroxymethyl-1,3-propanediol, 1,3-diaminopropanol-2, and morpholine. Examples of an organic solvent include 3-acetonealcohol, acetone, ethyl acetate, alkoxy ethanol having an alkoxy group having 1 to 4 carbon atoms, ethyl alcohol, isopropyl alcohol, butyl alcohol, diethylene glycol monomethyl ether, diethylene glycol monoethyl ether, and diethylene glycol monobutyl ether. These are used alone or in combination of two or more. Alternatively, a small amount of surfactant, antifoaming agent, or other matter may be added to the aqueous developer.

Examples of a method for development include dipping, puddling, spraying, brushing, and slapping. Among these examples, use of high pressure spraying is desirable from the resolution enhancement point of view.

Figure 5:
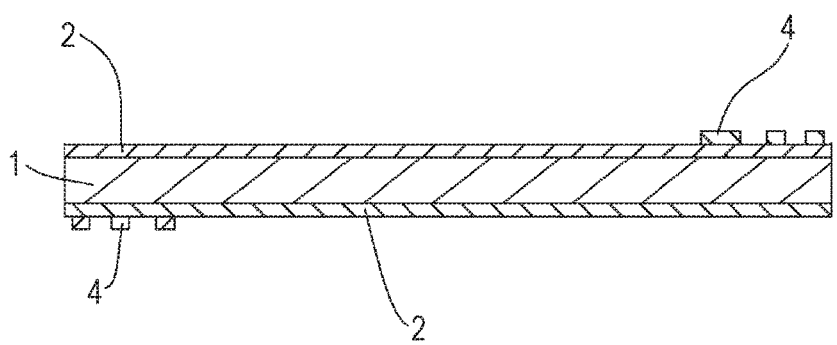
FIG. 5 is a schematic diagram of a step of developing the first photosensitive resin layers.

After these steps are performed, a product in which the first photosensitive resin layers 3 each functioning as the resist pattern 4 are disposed on the light-shielding metal layers 2 on both surfaces of the base film 1 is obtained (see FIG. 5).

4. Etching Step

In an etching step, the light-shielding metal layers 2 are concurrently etched using an etching solution, such as ferric chloride, to remove the portions of the light-shielding metal layers 2 on which the resist patterns 4 are not disposed.

Figure 6:
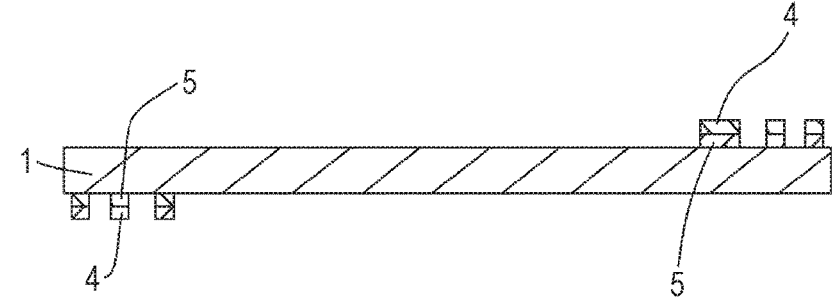
FIG. 6 is a schematic diagram of a step of etching the light-shielding metal layer.

After these steps are performed, a product in which the routed circuit patterns 5 are disposed on both surfaces of the base film 1 is obtained (see FIG. 6).

5. Resist Removal Step

Figure 7:
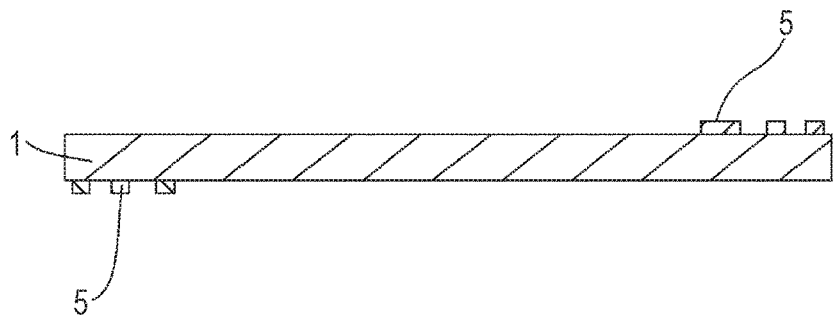
FIG. 7 is a schematic diagram of a step of removing the first photosensitive resin layers.

In a resist removal step according to this embodiment, the entirety of the first photosensitive resin layers 3 left on the patterned light-shielding metal layers 2 is removed using a resist remover to temporarily uncover the entire surfaces of the light-shielding metal layers 2 (see FIG. 7).

An acid remover or an alkaline remover is used as the resist remover. A remover containing an alkylbenzenesulfonic acid, a phenol compound, a chlorine-based solvent, an aromatic hydrocarbon, and other matter is commercially available as a typical example of an acid remover. A remover containing a water-soluble organic amine and an organic solvent such as dimethylsulfoxide is commercially available as an alkaline remover.

6. Step of Forming PAS Layer

Figure 8:
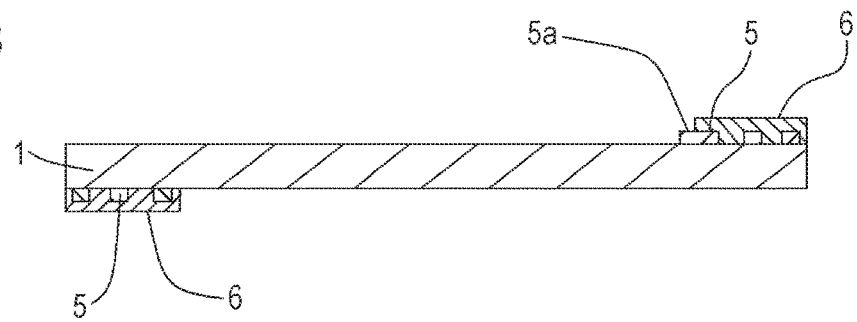
FIG. 8 is a schematic diagram of a step of forming PAS layers over routed circuit patterns.

Each passivation (PAS) layer functions as an insulating rustproof layer that covers the routed circuit pattern 5 except the connection portion 5a to protect the routed circuit pattern 5 (see FIG. 8). The PAS layers 6 may be formed by using the same material or by the same method as in the case of the resist patterns 4.

Method for Forming Electrode Pattern

A method for forming the electrode patterns 25 according to this embodiment of the invention is performed in the following steps after the above-described steps of forming the routed circuit patterns 5 are performed.

Figure 10:
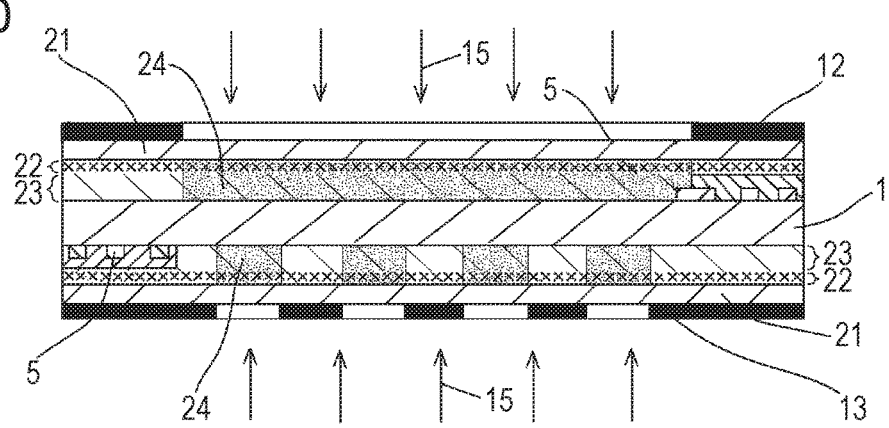
FIG. 10 is a schematic diagram of a step of exposing second photosensitive resin layers to light.
Figure 11:
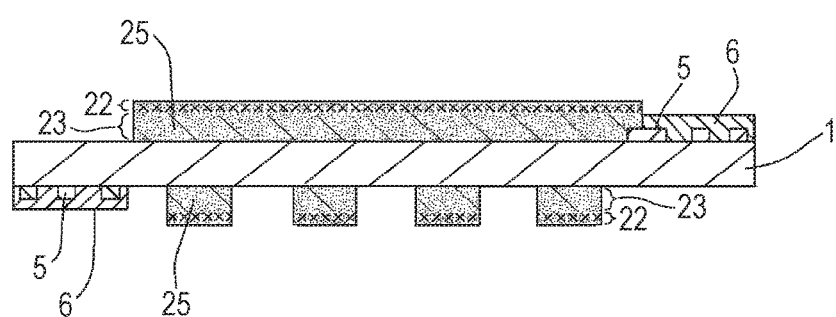
FIG. 11 is a schematic diagram of a step of developing the second photosensitive resin layers.

Specifically, the method for forming the electrode patterns 25 includes a laminating step (see FIG. 9), a light exposure step (step in FIG. 10), and a development step (see FIG. 11). In the laminating step, photosensitive electrically conductive films 20, each including a support film 21, an electrically conductive layer 22 disposed on the support film 21 and containing an electrically conductive fiber, and a second photosensitive resin layer 23 disposed on the electrically conductive layer 22, are laminated on both surfaces of the base film 1 on which the routed circuit patterns 5 are formed such that the second photosensitive resin layers 23 are tightly attached to both surfaces. In the light exposure step, the second photosensitive resin layers 23 of the photosensitive electrically conductive films 20 laminated on both surfaces of the base film 1 are irradiated with the ultraviolet light 15 through different pattern masks 12 and 13 on both surfaces. In the development step, the second photosensitive resin layers 23 subjected to light exposure are developed to concurrently remove the portions of the electrically conductive layers 22 laminated on the portions of the second photosensitive resin layers 23 that are to be removed and to form the electrode patterns 25 electrically connected to the routed circuit patterns 5. After these steps are performed, a touch sensor including patterned electrically conductive films (electrode patterns 25) on the base film 1 is obtained.

7. Laminating Step

Figure 9:
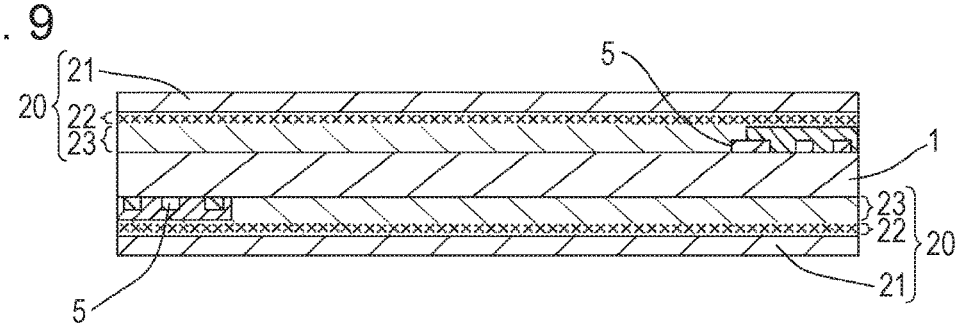
FIG. 9 is a schematic diagram of a step of laminating photosensitive electrically conductive films.

The laminating step illustrated in FIG. 9 is performed by, for example, laminating each photosensitive electrically conductive film 20 on the base film 1 while heating the photosensitive electrically conductive film 20 and attaching the photosensitive resin layer of the photosensitive electrically conductive film 20 to the base film 1 with pressure. Desirably, this laminating operation is performed at reduced pressure in view of adhesiveness and following ability.

Examples of the support films 21 include a polymer film having thermal resistance and solvent resistance such as a polyethylene terephthalate film, a polyethylene film, a polypropylene film, and a polycarbonate film. These polymer films are not allowed to be subjected to such a surface treatment that renders the films unremovable or not allowed to be made of such a material that renders the films unremovable since the polymer films have to be removable from the photosensitive resin layer later.

Preferably, the support films 21 have a thickness of 5 to 300 μm, more preferably, 10 to 200 m, or particularly preferably, 15 to 100 μm. If the support films 21 have a thickness of smaller than 5 μm, the support films 21 have lower mechanical strength and are more likely to be broken in a step of applying an electrically-conductive fiber dispersion fluid to form the electrically conductive layers 22 or a photosensitive resin composite to form the second photosensitive resin layers 23 or in a step of removing the support films 21 before the photosensitive resin layers 3 subjected to light exposure are developed. On the other hand, if the support films 21 have a thickness of greater than 300 μm, the patterns have low resolution when the second photosensitive resin layers 23 are irradiated with the ultraviolet light 15 through the support films 21 or the support films 21 cost more.

From the sensitivity and resolution enhancement points of view, the support film 21 preferably has a haze value of 0.01 to 5.0%, more preferably, 0.01 to 3.0%, particularly preferably, 0.01 to 2.0%, or extremely preferably, 0.01 to 1.0%. The haze value can be measured in accordance with JIS K 7105, for example, using a commercially available turbidimeter such as NDH-1001DP (product name manufactured from Nippon Denshoku Industries Co., Ltd.).

Examples of an electrically conductive fiber contained in the electrically conductive layers 22 include metal fibers such as gold, silver, or platinum and carbon fibers such as a carbon nanotube. These examples may be used alone or in combination of two or more. From the electric conductivity point of view, use of a gold fiber or a silver fiber is desirable. The gold fiber and the silver fiber may be used alone or in combination. From the view point of adjustment enhancement of electric conductivity of the electrically conductive films thus formed, a silver fiber is more desirable.

The above-described metal fiber can be prepared by, for example, reducing a metal ion with a reducer such as $NaBH_4$ or by a polyol method.

Preferably, the electrically conductive fiber has a fiber diameter of 1 nm to 50 nm, more preferably, 2 nm to 20 nm, or particularly preferably, 3 nm to 10 nm. Preferably, the electrically conductive fiber has a fiber length of 1 μm to 100 μm, more preferably, 2 μm to 50 μm, or particularly preferably, 3 μm to 10 μm.

Preferably, each electrically conductive layer 22 has a network structure in which pieces of the electrically conductive fiber touch one another. In this embodiment, each electrically conductive layer 22 having such a network structure would suffice if it is formed on the surface of the support film 21 of the second photosensitive resin layer 23 and if the surface exposed when the support film 21 is removed provides electric conductivity in its surface direction. Thus, the definition of "the second photosensitive resin layers 23 disposed on the electrically conductive layers 22" in the description includes the case where each electrically conductive layer 22 having a network structure is formed so as to be included in the top layer of the second photosensitive resin layer 23 facing the support film 21.

The thickness of each electrically conductive layer 22 varies depending on the purpose or the desired electric conductivity of the electrically conductive film or the electrically conductive pattern formed using the photosensitive electrically conductive film 20, but is preferably smaller than or equal to 1 μm, or more preferably, 1 nm to 0.5 μm, or particularly preferably, 5 nm to 0.1 μm. When the electrically conductive layer 22 has a thickness of smaller than or equal to 1 μm, the electrically conductive layer 22 has high transmittance of light within the wavelength range of 450 to 650 nm and high pattern-workability, and is thus particularly desirable in forming a transparent electrode.

Each electrically conductive layer 22 containing an electrically conductive fiber can be formed by, for example, applying, to the support film 21, an electrically conductive fiber dispersion fluid and drying the electrically conductive fiber dispersion fluid, the electrically conductive fiber dispersion fluid being obtained by adding the above-described electrically conductive fiber to water and/or an organic solvent, and, if needed, adding, for example, a dispersion stabilizer such as a surfactant. After dried, the electrically conductive layer 22 formed on each support film 21 may be laminated as needed. Application may be performed by a publicly known method such as roll coating, comma coating, gravure coating, air knife coating, die coating, bar coating, or spray coating. Drying may be performed using, for example, a hot-air convection dryer for about 1 to 30 minutes at 30 to 150° C. In each electrically conductive layer 22, the electrically conductive fiber may coexist with a surfactant or a dispersion stabilizer.

Examples of the second photosensitive resin layers 23 include those formed from (a) a binder polymer, (b) a photopolymerizable compound having an ethylenically unsaturated bond, and (c) a photosensitive resin composite containing a photopolymerization initiator.

Examples of (a) a binder polymer include an acrylic resin, a styrene resin, an epoxy resin, an amide resin, an amide epoxy resin, an alkyd resin, a phenolic resin, an ester resin, a polyurethane resin, an epoxy acrylate resin obtained by causing a reaction between an epoxy resin and a (meth)acrylic acid, and an acid modified epoxy acrylate resin obtained by causing a reaction between an epoxy acrylate resin and an acid anhydride. These resins may be used alone or in combination of two or more.

A photopolymerizable compound having an ethylenically unsaturated bond is preferable as (b) a photopolymerizable compound having an ethylenically unsaturated bond. Examples of a photopolymerizable compound having an ethylenically unsaturated bond include a compound obtained by causing a reaction between a polyhydric alcohol and an α,β-unsaturated carboxylic acid, bisphenol A-based (meth)acrylate compounds, such as 2,2-bis(4-((meth)acryloxy polyethoxy)phenyl) propane, 2,2-bis(4-((meth)acryloxy polypropoxy)phenyl) propane, and 2,2-bis(4-((meth)acryloxy polyethoxy polypropoxy)phenyl) propane, compounds obtained by causing a reaction between a glycidyl group-containing compound and an α,βunsaturated carboxylic acid, urethane monomers, such as a (meth)acrylate compound having a urethane bond, γ-chloro-β-hydroxypropyl-β'-(meth)acryloyloxyethyl-o-phthalate, β-hydroxyethyl-β'-(meth)acryloyloxyethyl-o-phthalate, β-hydroxypropyl-β'-(meth)acryloyloxyethyl-o-phthalate, and (meth)acrylic acid alkyl ester. These are used alone or in combination of two or more.

Examples of (c) a photopolymerization initiator include aromatic ketones, such as benzophenone, N,N'-tetramethyl-4,4'-diaminobenzophenone (Michler ketone), N,N'-tetraethyl-4,4'-diaminobenzophenone, 4-methoxy-4'-dimethylaminobenzophenone, 2-benzyl-2-dimethylamino-1-(4-morpholinophenyl)-butanone-1, and 2-methyl-1-[4-(methylthio)phenyl]-2-morpholino-propanone-1, quinones, such as 2-ethylanthraquinone, phenanthrenequinone, 2-tert-butylanthraquinone, octamethylanthraquinone, 1,2-benzanthraquinone, 2,3-benzanthraquinone, 2-phenylanthraquinone, 2,3-diphenylanthraquinone, 1-chloroanthraquinone, 2-methylanthraquinone, 1,4-naphthoquinone, 9,10-phenanthraquinone, 2-methyl 1,4-naphthoquinone, and 2,3-dimethylanthraquinone, benzoin ether compounds, such as benzoin methyl ether, benzoin ethyl ether, and benzoin phenyl ether, benzoin compounds, such as benzoin, methylbenzoin, and ethylbenzoin, oxime ester compounds, such as 1,2-octanedione-1-[4-(phenylthio)phenyl]-2-(O-benzoyloxime), and 1-[9-ethyl-6-(2-methylbenzoyl)-9H-carbazol-3-yl]ethanone 1-(O-acetyloxime), benzyl derivatives, such as benzyldimethyl ketal, 2,4,5-triarylimidazole dimers, such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, a 2-(o-methoxyphenyl)-4,5-diphenylimidazole dimer, and a 2-(p-methoxyphenyl)-4,5-diphenylimidazole dimer, acridine derivatives, such as 9-phenylacridine and 1,7-bis(9,9'-acridinyl)heptane, N-phenylglycine, N-phenylglycine derivatives, coumarin based compounds, and oxazole based compounds. These are used alone or in combination of two or more.

The second photosensitive resin layers 23 may be formed by applying, to the support films 21 on which the electrically conductive layers 22 are formed, a solution obtained by dissolving, into a solvent, a solid of a photosensitive resin composite of approximately 10 to 60 percent by mass and drying the solution. Here, the content of the organic solvent left in the dried photosensitive resin layer is preferably smaller than or equal to 2 percent by mass to prevent dispersion of the organic solvent in the subsequent steps.

Application may be performed by a publicly known method such as roll coating, comma coating, gravure coating, air knife coating, die coating, bar coating, or spray coating. Drying performed after the application to remove the organic solvent or the like may be performed using, for example, a hot-air convection dryer for about 5 to 30 minutes at 70 to 150° C.

Preferably, the thickness of each second photosensitive resin layer 23 after dried is typically 1 µm to 15 µm, or more preferably, 1 to 10 µm. When the second photosensitive resin layers 23 are to have a thickness of smaller than 1 µm, application would be difficult. When the second photosensitive resin layers 23 have a thickness of greater than 15 µm, the photosensitive resin layers are more likely to have insufficient sensitivity due to its low light transmission and low photocuring efficiency after the layers are transferred.

The second photosensitive resin layers 23 particularly preferably have a thickness of smaller than or equal to 2 µm in the case, as in the case of the embodiment, where each photosensitive electrically conductive film 20 includes the support film 21, the electrically conductive layer 22 containing an electrically conductive fiber, and the second photosensitive resin layer 23, which are arranged in this order. When the thickness exceeds 2 µm, the conductivity between the second photosensitive resin layers 23 and the routed circuits may be lowered.

In each photosensitive electrically conductive film 20 according to this embodiment, the laminated body including the electrically conductive layer 22 and the second photosensitive resin layer 23 preferably has, when the total film thickness of both layers is 1 to 10 µm, a minimum transmittance of light within the wavelength range of 450 to 650 nm of higher than or equal to 80%, or more preferably, higher than or equal to 85%. When the electrically conductive layer 22 and the second photosensitive resin layer 23 satisfy the above-described conditions, the display panel or the like can easily have high luminance.

In addition, the total thickness of each electrically conductive layer 22 and the corresponding second photosensitive resin layer 23 is preferably smaller than or equal to 3 µm. If the thickness exceeds 3 µm, the level difference between the portions in which the electrode pattern 25 is formed and not formed increases and renders the pattern visible.

Each photosensitive electrically conductive film 20 may also include another layer such as an adhesive layer.

8. Light Exposure Step

In a light exposure step according to this embodiment, when the support film 21 on each electrically conductive layer 22 is transparent to the ultraviolet light 15, the ultraviolet light 15 can be applied to the second photosensitive resin layer 23 through the support film 21. When the support film 21 has light-shielding properties, the support film 21 is removed and then the ultraviolet light 15 is applied to the second photosensitive resin layer 23.

The details of the light exposure method are the same as those described in the light exposure step in the method for forming the routed circuit patterns 5. Thus, the same description is not given here.

As described above, the base film 1 according to the embodiment has a UV-blocking function. When both surfaces of the base film 1 are to be concurrently exposed to light, a layer having a UV-blocking function is used as the base film 1. Using a layer having a UV-blocking function as the base film 1 can prevent part of the ultraviolet light 15 emitted from the side of one of the surfaces of the base film 1 and not absorbed by the corresponding second photosensitive resin layer 23 from arriving at the second photosensitive resin layer 23 on the other surface of the base film 1.

After these steps are performed, the second photosensitive resin layers 23 each having the cure pattern 24 are formed on both surfaces of the base film 1 on which the routed circuit patterns 5 are formed (see FIG. 10). In this embodiment, after the support films 21 are removed, the second photosensitive resin layers 23 may be further cured, if needed, by heating the second photosensitive resin layers 23 at approximately 60 to 250° C. or exposing the second photosensitive resin layers 23 to light at approximately 0.2 to 10 J/cm2.

9. Development Step

In a development step according to this embodiment, the portion of each second photosensitive resin layer 23 other than the cured portion is removed. Specifically, when each transparent support film 21 lies over the corresponding electrically conductive layer 22, the support film 21 is removed first and then the portion of the corresponding second photosensitive resin layer 23 other than the cured portion is removed by wet development. Thus, the electrically conductive layer 22 containing an electrically conductive fiber is left on the resin cured layer having a predetermined pattern, so that the electrode pattern 25 is formed (see FIG. 11).

The details of wet development are the same as those described in the development step in the method for forming the routed circuit patterns 5. Thus, the same description is not given here.

In the method for forming the electrode patterns 25 according to the embodiment, after development, the electrically conductive patterns may be further cured, if needed, by heating the electrically conductive patterns 25 at approximately 60 to 250° C. or exposing the electrically conductive patterns 25 to light at approximately 0.2 to 10 J/cm2.

As described above, the method for manufacturing a touch sensor according to the invention is capable of concurrently forming routed circuit patterns on both surfaces of the base film and achieving a touch screen having top and bottom surfaces aligned with each other with high accuracy.

Second Embodiment

Method for Forming Another Electrode Pattern

This embodiment is partially different from the method for manufacturing a touch sensor according to the first embodiment in terms of a method for forming the electrode patterns 25.

Figure 12:
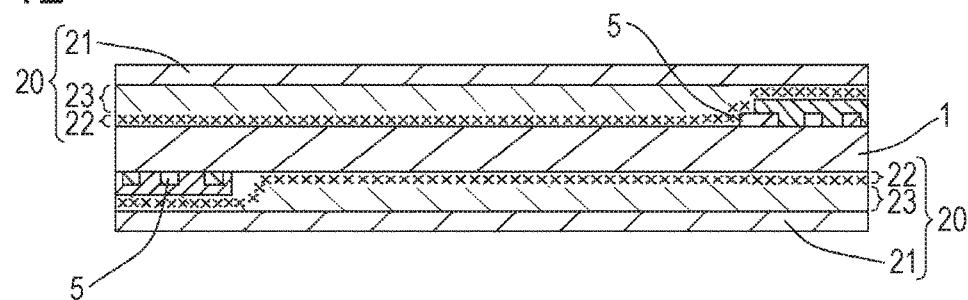
FIG. 12 is a schematic diagram of another step of laminating the photosensitive electrically conductive films.
Figure 13:
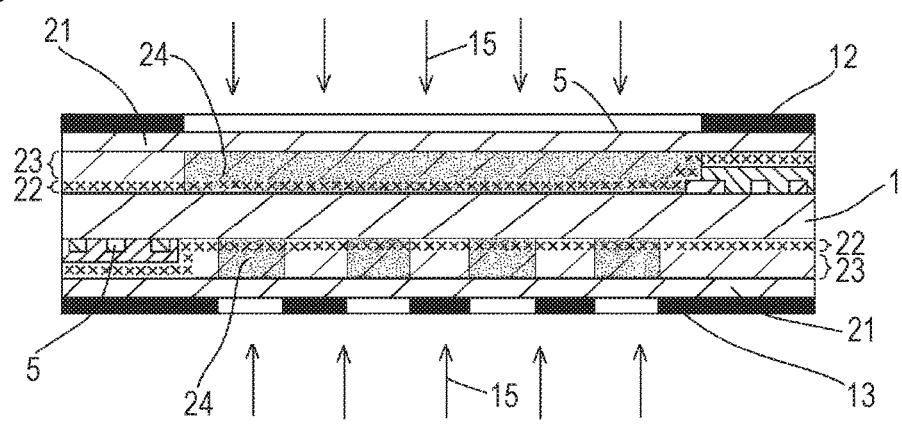
FIG. 13 is a schematic diagram of another step of exposing the second photosensitive resin layers to light.
Figure 14:
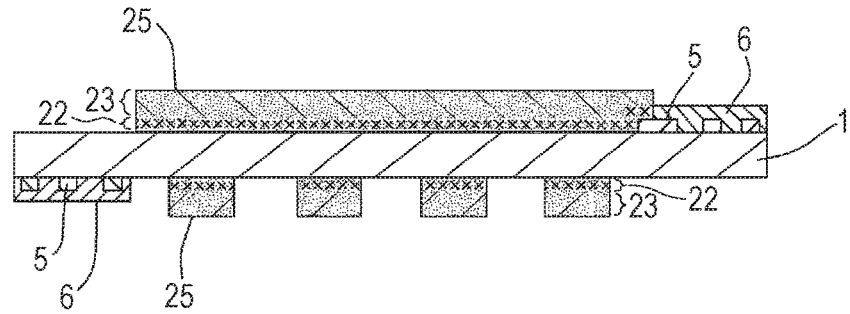
FIG. 14 is a schematic diagram of another step of developing the second photosensitive resin layers.

Specifically, the method for forming the electrode patterns 25 according to the embodiment of the invention includes a laminating step (see FIG. 12), a light exposure step (see FIG. 13), and a development step (see FIG. 14). In the laminating step, photosensitive electrically conductive films 20, each including a support film 21, a second photosensitive resin layer 23 disposed on the support film 21, and an electrically conductive layer 22 disposed on the second photosensitive resin layer 23 and containing an electrically conductive fiber, are laminated on both surfaces of a base film 1 on which routed circuit patterns 5 are formed such that the electrically conductive layers 22 are tightly attached to both surfaces. In the light exposure step, the second photosensitive resin layers 23 of the photosensitive electrically conductive films 20 laminated on both surfaces of the base film 1 are irradiated with ultraviolet light 15 through different pattern masks 12 and 13 over both surfaces. In the development step, the second photosensitive resin layers 23 subjected to light exposure are developed to concurrently remove the portions of the electrically conductive layers 22 laminated on the portions of the second photosensitive resin layers 23 that are to be removed and to form electrode patterns 25 electrically connected to the routed circuit patterns 5. After these steps are performed, a touch sensor including patterned electrically conductive films (electrode patterns 25) on the base film is obtained.

The first embodiment and the second embodiment are different from each other in the following point. In the first embodiment, each photosensitive electrically conductive film 20 is formed by laminating the support film 21, the electrically conductive layer 22, and the second photosensitive resin layer 23 one on top of another in this order (so-called face-up type). On the other hand, in this embodiment, each photosensitive electrically conductive film 20 is formed by laminating the support film 21, the second photosensitive resin layer 23, and the electrically conductive layer 22 one on top of another in this order (so-called face-down type). The definition of "the electrically conductive layers 22 containing an electrically conductive fiber and disposed on the respective second photosensitive resin layers 23" in the description includes the case where each electrically conductive layer 22 having a network structure is formed so as to be included in the top layer of the corresponding second photosensitive resin layer 23 opposite to the side on which the support film 21 is disposed.

Forming a face-down type of the photosensitive electrically conductive films 20 allows each light-shielding metal layer 2 having the routed circuit pattern 5 and the corresponding electrically conductive layer 22 having the electrode pattern 25 to directly touch each other. Thus, the routed circuit and the electrode can be reliably electrically connected to each other without reducing the thickness of the second photosensitive resin layer 23.

Other components the same as those in the first embodiment are not described.

Third Embodiment

The following component may be further added in the first embodiment and the second embodiment.

Specifically, before the step of laminating the photosensitive electrically conductive film 20 is performed, a roughening step may be added in which a portion of the exposed surface of the light-shielding metal layer 2 corresponding to each routed circuit pattern 5 that overlaps the electrode pattern 25 is roughened.

Adding such a step enhances the adhesion between each routed circuit pattern 5 and the corresponding electrode pattern 25. Preferably, the surface roughened in the roughening step has an arithmetic mean roughness (Ra) of 1 nm to 50 nm measured in accordance with JIS B 0601-2001.

Modified Example

In the method for forming the routed circuits according to each embodiment, the entirety of the first photosensitive resin layers 3 left on the light-shielding metal layers 2 are removed by a resist remover and then the portions of the routed circuit patterns 5 except the connection portions 5a are covered with the PAS layers 6. However, the method is not limited to this. For example, only portions of the first photosensitive resin layers 3 left on the light-shielding metal layers 2 corresponding to the connection portions 5a may be removed. In this case, the remaining portions of the first photosensitive resin layers 3 function as the PAS layers 6.

REFERENCE SIGNS LIST 1 base film
1a center portion
1b external frame portion
2 light-shielding metal layer
3 first photosensitive resin layer
3a cure pattern
4 resist pattern
5 routed circuit pattern
5a connection portion
6 PAS layer
10, 11, 12, 13 pattern mask
15 ultraviolet light
20 photosensitive electrically conductive film
21 support film
22 electrically conductive layer containing electrically conductive fiber
23 second photosensitive resin layer
24 cure pattern
25 electrode pattern
30 touch sensor

The invention claimed is:

1. A method for forming a touch sensor, comprising the steps of:
    forming light-shielding metal layers on two surfaces of a base film having a UV-blocking function and first photosensitive resin layers on the light-shielding metal layers;
    irradiating the first photosensitive resin layers on the light-shielding metal layers with ultraviolet light through different pattern masks over the two surfaces;
    forming resist patterns by developing the first photosensitive resin layers that have been irradiated with ultraviolet light;
    removing portions of the light-shielding metal layers not covered with the resist patterns to form routed circuit patterns comprising portions of the light-shielding metal layers covered with the resist patterns;
    removing at least portions of the first photosensitive resin layers covering the routed circuit patterns, the at least portions corresponding to connection portions;
    laminating, on each of the two surfaces of the base film on which the routed circuit patterns are formed, a photosensitive electrically conductive film including a second photosensitive resin layer tightly attached to each of the two surfaces, an electrically conductive layer disposed on the second photosensitive resin layer, and a support film disposed on the electrically conductive layer, the electrically conductive layer containing an electrically conductive fiber;
    irradiating the second photosensitive resin layers of the photosensitive electrically conductive films laminated on the two surfaces of the base film with ultraviolet light through different pattern masks over the two surfaces; and removing the support film before or after the irradiating the second photosensitive resin layers, and then developing portions of the second photosensitive resin layers that are subjected to light exposure and portions of the electrically conductive layers laminated on the portions of the second photosensitive resin layers that are subjected to light exposure to concurrently remove portions of the second photosensitive resin layers that are not subjected to light exposure and portions of the electrically conductive layers laminated on the portions of the second photosensitive resin layers that are not subjected to light exposure and to form electrode patterns electrically connected to the routed circuit patterns, the electrode patterns comprising the portions of the second photosensitive resin layers that are subjected to light exposure and the portions of the electrically conductive layers laminated on the portions of the second photosensitive resin layers that are subjected to light exposure.

2. The method for forming a touch sensor according to claim 1, wherein the second photosensitive resin layer has a thickness of between about 1 µm to 2 µm.

3. The method for forming a touch sensor according to claim 2, wherein the total thickness of one of the second photosensitive resin layers and one of the electrically conductive layers is between about 1 to 3 µm.

4. The method for forming a touch sensor according to claim 3,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

5. The method for forming a touch sensor according to claim 2,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

6. The method for forming a touch sensor according to claim 1, wherein the total thickness of one of the second photosensitive resin layers and one of the electrically conductive layers is between about 1 to 3 µm.

7. The method for forming a touch sensor according to claim 6,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

8. The method for forming a touch sensor according to claim 1,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

9. The method for forming a touch sensor according to claim 1, comprising a further step of roughening portions of exposed surfaces of the light-shielding metal layers, the portions corresponding to the routed circuit patterns to be overlapped with the electrode patterns after the electrode patterns are formed, the roughening step being performed before laminating of the photosensitive electrically conductive films is performed.

10. The method for forming a touch sensor according to claim 9, wherein a surface roughened in the roughening step has an arithmetic mean roughness (Ra) of 1 nm to 50 nm measured in accordance with JIS B 0601-2001.

11. The method for forming a touch sensor according to claim 1, the second photosensitive resin layer has a thickness of smaller than or equal to 2 µm.

12. The method for forming a touch sensor according to claim 1, wherein the base film comprises a light-absorbing material.

13. The method for forming a touch sensor according to claim 1, wherein, in the step of removing portions of the light-shielding metal layers not covered with the resist patterns to form the routed circuit patterns, the routed circuit patterns consists of the portions of the light-shielding metal layers covered with the resist patterns.

14. The method for forming a touch sensor according to claim 1, wherein the electrode patterns consists of the portions of the second photosensitive resin layers that are subjected to light exposure and the portions of the electrically conductive layers laminated on the portions of the second photosensitive resin layers that are subjected to light exposure.

15. A method for forming a touch sensor, comprising the steps of:
forming light-shielding metal layers on two surfaces of a base film having a UV-blocking function and first photosensitive resin layers on the light-shielding metal layers;
irradiating the first photosensitive resin layers on the light-shielding metal layers with ultraviolet light through different pattern masks over the two surfaces;
forming resist patterns by developing the first photosensitive resin layers that have been irradiated with ultraviolet light;
removing portions of the light-shielding metal layers not covered with the resist pattern to form routed circuit patterns comprising the light-shielding metal layers covered with the resist pattern;
removing at least portions of the first photosensitive resin layers covering the routed circuit patterns, the at least portions corresponding to connection portions;
laminating, on each of the two surfaces of the base film on which the routed circuit patterns are formed, a photosensitive electrically conductive film including an electrically conductive layer tightly attached to each of the two surfaces, a second photosensitive resin layer disposed on the electrically conductive layer, and a support film disposed on the second photosensitive resin layer, the electrically conductive layer containing an electrically conductive fiber;

irradiating the second photosensitive resin layers of the photosensitive electrically conductive films laminated on the two surfaces of the base film with ultraviolet light through different pattern masks over the two surfaces; and removing the support film before or after the irradiating the second photosensitive resin layers, and then developing portions of the second photosensitive resin layers that are subjected to light exposure and portions of the electrically conductive layers on which the portions of the second photosensitive resin layers that are subjected to light exposure are laminated to concurrently remove portions of the second photosensitive resin layers that are not subjected to light exposure and portions of the electrically conductive layers on which the portions of the second photosensitive resin layers that are not subjected to light exposure are laminated and to form electrode patterns electrically connected to the routed circuit patterns, the electrode patterns comprising the portions of the second photosensitive resin layers that are subjected to light exposure and the portions of the electrically conductive layers on which the portions of the second photosensitive resin layers that are subjected to light exposure are laminated.

16. The method for forming a touch sensor according to claim 15, wherein the total thickness of one of the second photosensitive resin layers and one of the electrically conductive layers is between about 1 to 3 μm.

17. The method for forming a touch sensor according to claim 16,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

18. The method for forming a touch sensor according to claim 15,
wherein the step of removing at least portions of the first photosensitive resin layers is performed to entirely remove the first photosensitive resin layers, and
wherein the method comprises the further step of covering portions of the light-shielding metal layers corresponding to the routed circuit patterns with PAS layers, except the connection portions, before laminating of the photosensitive electrically conductive films is performed.

* * * * *